(12) United States Patent
Kijima

(10) Patent No.: US 7,056,750 B2
(45) Date of Patent: Jun. 6, 2006

(54) FERROELECTRIC FILM, METHOD OF MANUFACTURING FERROELECTRIC FILM, FERROELECTRIC CAPACITOR, AND FERROELECTRIC MEMORY

(75) Inventor: Takeshi Kijima, Matsumoto (JP)

(73) Assignee: Seiko Epson Corporation, Tokyo (JP)

( * ) Notice: Subject to any disclaimer, the term of this patent is extended or adjusted under 35 U.S.C. 154(b) by 14 days.

(21) Appl. No.: 10/960,001

(22) Filed: Oct. 8, 2004

(65) Prior Publication Data

US 2005/0117439 A1  Jun. 2, 2005

(30) Foreign Application Priority Data

Oct. 15, 2003  (JP)  ............... 2003-355046

(51) Int. Cl.
*H01L 21/00* (2006.01)
(52) U.S. Cl. .......................... 438/3; 438/240
(58) Field of Classification Search ............. 438/3, 438/240, 761–764, 778–785
See application file for complete search history.

(56) References Cited

U.S. PATENT DOCUMENTS

2003/0059959 A1*  3/2003  Hong ..................... 438/3

* cited by examiner

*Primary Examiner*—H. Jey Tsai
(74) *Attorney, Agent, or Firm*—Oliff & Berridge, PLC

(57) ABSTRACT

A method of manufacturing a ferroelectric film including: forming a ferroelectric initial nucleus layer by using a solution of a first ferroelectric material and electrodepositing the first ferroelectric material on an electrode by hydrothermal electrodeposition; electrically charging particles of a second ferroelectric material; forming a ferroelectric material film by electrodepositing the electrically-charged particles of the second ferroelectric material on the ferroelectric initial nucleus layer by electrophoretic deposition; and subjecting the ferroelectric material film to a heat treatment.

5 Claims, 5 Drawing Sheets

FERROELECTRIC FILM, METHOD OF MANUFACTURING FERROELECTRIC FILM, FERROELECTRIC CAPACITOR, AND FERROELECTRIC MEMORY

Japanese Patent Application No. 2003-355046, filed on Oct. 15, 2003, is hereby incorporated by reference in its entirety.

BACKGROUND OF THE INVENTION

The present invention relates to a ferroelectric film, a method of manufacturing a ferroelectric film, a ferroelectric capacitor, and a ferroelectric memory.

When forming a ferroelectric film used in a semiconductor device such as a ferroelectric memory (FeRAM), a ferroelectric film is formed in an area larger than the necessary area, and is patterned by a lithographic technology so that the necessary area remains. In this case, damage easily occurs on the ferroelectric film from etching performed at the time of patterning. As a result, the crystal quality of the ferroelectric film deteriorates, whereby a problem such as occurrence of a leakage current may occur.

BRIEF SUMMARY OF THE INVENTION

According to a first aspect of the present invention, there is provided a method of manufacturing a ferroelectric film, comprising:

forming a ferroelectric initial nucleus layer by using a solution of a first ferroelectric material and electrodepositing the first ferroelectric material on an electrode by hydrothermal electrodeposition;

electrically charging particles of a second ferroelectric material;

forming a ferroelectric material film by electrodepositing the electrically-charged particles of the second ferroelectric material on the ferroelectric initial nucleus layer by electrophoretic deposition; and subjecting the ferroelectric material film to a heat treatment.

According to a second aspect of the present invention, there is provided a ferroelectric film manufactured by the above-described method.

According to a third aspect of the present invention, there is provided a ferroelectric capacitor comprising the above ferroelectric film.

According to a fourth aspect of the present invention, there is provided a ferroelectric memory cell comprising the above ferroelectric film.

DETAILED DESCRIPTION OF THE EMBODIMENTS

Figure 1:
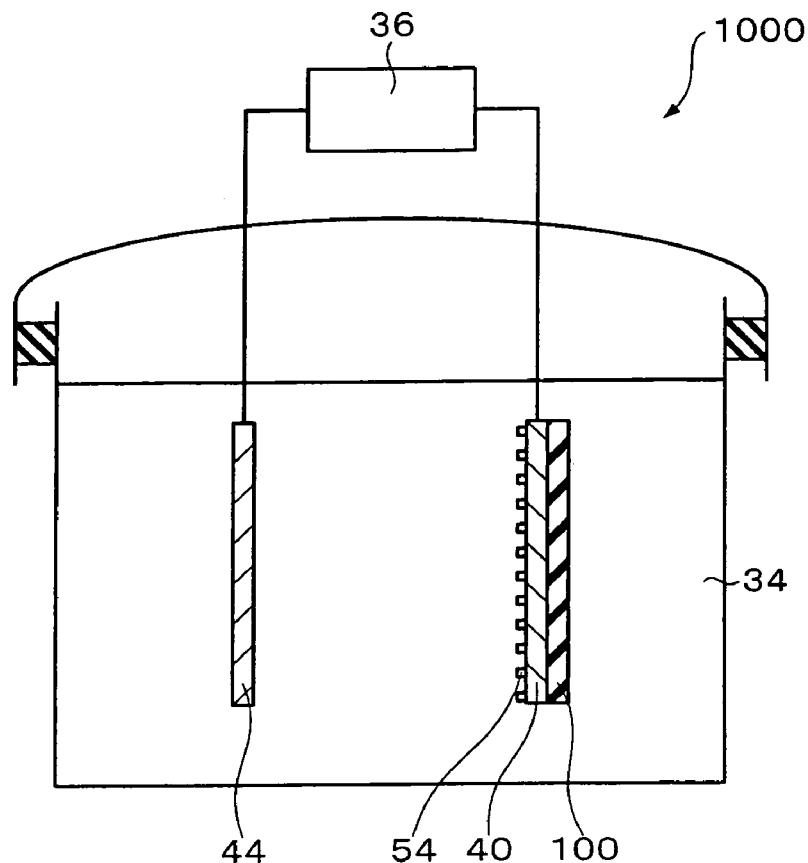
FIG. 1 is a diagram schematically showing a method of manufacturing a ferroelectric film according to one embodiment of the present invention.

The following embodiments of the present invention may provide a method of manufacturing a ferroelectric film having excellent crystal quality and a ferroelectric film obtained by this manufacturing method. The following embodiments may also provide a ferroelectric capacitor and a ferroelectric memory to which the ferroelectric film according to the embodiments is applied.

According to one embodiment of the present invention, there is provided a method of manufacturing a ferroelectric film, comprising:

forming a ferroelectric initial nucleus layer by using a solution of a first ferroelectric material and electrodepositing the first ferroelectric material on an electrode by hydrothermal electrodeposition;

electrically charging particles of a second ferroelectric material;

forming a ferroelectric material film by electrodepositing the electrically-charged particles of the second ferroelectric material on the ferroelectric initial nucleus layer by electrophoretic deposition; and subjecting the ferroelectric material film to a heat treatment.

Electrically charging the particles of the second ferroelectric material includes: direct electrical charging in which the particles are directly electrically-charged; and the indirect electrical charging in which the particles are indirectly electrically-charged by using a substance differing from the particles of the second ferroelectric material.

In this method of manufacturing a ferroelectric film, the ferroelectric initial nucleus layer having excellent crystallinity and orientation is formed by hydrothermal electrodeposition. The ferroelectric material film is then formed by electrophoretic deposition. In the following heat treatment, the ferroelectric material film is crystallized with excellent crystallinity and orientation because of the ferroelectric initial nucleus layer having excellent crystallinity and orientation. As a result, a ferroelectric film having excellent crystallinity and orientation can be obtained.

In this method of manufacturing a ferroelectric film, the ferroelectric initial nucleus layer may be formed in the shape of islands.

In this method of manufacturing a ferroelectric film, the second ferroelectric material may be amorphous.

In this method of manufacturing a ferroelectric film, the step of electrically charging the particles of the second ferroelectric material may include:

forming coated particles by covering surfaces of the particles of the second ferroelectric material with a porous layer; and causing the porous layer to absorb ions.

In this method of manufacturing a ferroelectric film, the porous layer may be a silicate.

According to one embodiment of the present invention, there is provided a ferroelectric film manufactured by the above-described method.

According to one embodiment of the present invention, there is provided a ferroelectric capacitor comprising the above ferroelectric film.

According to one embodiment of the present invention, there is provided a ferroelectric memory cell comprising the above ferroelectric film.

These embodiments will be described in detail with reference to the drawings.

1. Method of Manufacturing a Ferroelectric Film

A method of manufacturing a ferroelectric film according to an embodiment of the present invention is described below. FIGS. 1 to 5 are views schematically showing a method of manufacturing a ferroelectric film according to an embodiment of the present invention. As the ferroelectric film, a ferroelectric film having a perovskite structure (PbZrTiO ferroelectric film, for example) and a ferroelectric film having a layered perovskite structure (BiLaTiO, BiTiO, or SrBiTaO ferroelectric film, for example) can be given.

A ferroelectric initial nucleus layer is formed by hydrothermal electrodeposition. The details are described below.

An aqueous solution 34 of a ferroelectric material used for hydrothermal electrodeposition (hereinafter called "first ferroelectric material") is formed. In more detail, the first ferroelectric material is dissolved in a material aqueous solution. The first ferroelectric material is ionized in the aqueous solution 34. When using a PbZrTiO compound as the first ferroelectric material, $Pb(OH)_2$, $ZrOCl_2$, $TiO_2$, or the like may be used. In this case, the aqueous solution 34 contains $Pb^{2+}$, $Zr^{4+}$, and $Ti^{4+}$ ions. The ion concentration of $Pb^{2+}$ is about 0.5 mol/L, the ion concentration of $Zr^{4+}$ is about 0.2 mol/L, and the ion concentration of $Ti^{4+}$ is about 0.3 mol/L, for example.

When using a BiLaTiO compound as the first ferroelectric material, $Bi_2O_3$, $C_3H_9Bi$, $C_{24}H_{45}BiO_6$, or the like may be used as the Bi material, $La_2O_3$, $C_9H_{21}O_{C18}H_{54}N_3LaSi_6$, or the like may be used as the La material, and $TiO_2$, $C_{16}H_{30}O_6Ti$, $C_8H_{24}N_4Ti$, or the like may be used as the Ti material. In this case, the aqueous solution 34 contains $Bi^{3+}$, $La^{3+}$, and $Ti^{4+}$ ions. When using a BiTiO compound, $Bi_2O_3$, $C_3H_9Bi$, $C_{24}H_{45}BiO_6$, or the like may be used as the Bi material, and $TiO_2$, $C_{16}H_{30}O_6$ $C_8H_{24}N_4Ti$, or the like may be used as the Ti material. In this case, the aqueous solution 34 contains $Bi^{3+}$ and $Ti^{4+}$ ions. When using an SrBiTaO compound, $Sr_2O_3$, $C_6H_{14}O_2Sr$, $C_8H_{18}O_4Sr$, $C_{22}H_{38}O_4Sr$, or the like may be used as the Sr material, Bi $C_3H_9Bi$, $C_{24}H_{45}BiO_6$, or the like may be used as the Bi material, and $Ta_2O_5$, $C_{20}H_{45}C_{10}H_{25}O_5Ta$, or the like may be used as the Ta material. In this case, the aqueous solution 34 contains $Sr^{3+}$, $Bi^{3+}$, and $Ta^{5+}$ ions.

As the material aqueous solution, a potassium hydroxide aqueous solution, a sodium hydroxide aqueous solution, or the like may be used. When using a potassium hydroxide aqueous solution as the material aqueous solution, the pH of the potassium hydroxide aqueous solution is about 10 to 12 taking the composition of the resulting ferroelectric initial nucleus layer and the like into consideration, although the pH differs depending on the type of the ferroelectric film.

As shown in FIG. 1, a first electrode 40 and a second electrode 44 of a hydrothermal electrodeposition device 1000 are immersed in the aqueous solution 34. As the first electrode 40, platinum, silver, nickel, SRO ($SrRuO_3$), or the like may be used. The first electrode 40 is formed on a substrate 100. As the substrate 100, glass, plastic, silicon, or the like may be used. As the second electrode 44, platinum, silver, nickel, or the like may be used.

The aqueous solution 34 is heated to a desired temperature. When using a potassium hydroxide aqueous solution as the material aqueous solution, the desired temperature is about 50 to 180° C. taking the composition of the resulting ferroelectric initial nucleus layer and the like into consideration, although the desired temperature differs depending on the type of the ferroelectric film.

In hydrothermal electrodeposition, the compositional ratio of the ferroelectric initial nucleus layer 54 may be controlled by adjusting the pH of the material aqueous solution, the temperature of the aqueous solution 34, and the like. When forming a PbZrTiO ferroelectric initial nucleus layer 54, it is preferable to use a potassium hydroxide aqueous solution with a pH of 12 as the material aqueous solution, and to adjust the temperature of the aqueous solution 34 to 110° C. This enables the composition of the ferroelectric initial nucleus layer 54 to be Pb:Zr:Ti=10:2:8.

A desired voltage is applied between the first electrode 40 and the second electrode 44 by using a power supply 36. The desired voltage is 0.5 to 2 V taking crystallinity and orientation of the ferroelectric initial nucleus layer 54 into consideration, for example. The ferroelectric initial nucleus layer 54 is formed over a time sufficient to improve crystallinity and orientation by adjusting the voltage in this range.

In this step, the ionized first ferroelectric material is deposited on the surface of the first electrode 40 by migration. The ferroelectric initial nucleus layer 54 is formed on the surface of the first electrode 40. The ferroelectric initial nucleus layer 54 is formed to be scattered in the shape of islands. The ferroelectric initial nucleus layer 54 which is an insulator does not cover the entire surface of the first electrode 40 by forming the ferroelectric initial nucleus layer 54 to be scattered in the shape of islands. Therefore, an electric field can be caused to occur between electrodes of an electrophoretic deposition device when using an electrophoretic deposition method described later, whereby electrophoretic deposition can be performed. The ferroelectric initial nucleus layer 54 has such a thickness that the ferroelectric initial nucleus layer 54 is formed in the shape of islands. For example, the thickness of the ferroelectric initial nucleus layer 54 is about several to 20 nm.

In the above-described hydrothermal electrodeposition, the ferroelectric initial nucleus layer 54 is formed over a time sufficient to improve crystallinity and orientation. Specifically, the ferroelectric initial nucleus layer 54 having excellent crystallinity and orientation can be formed.

A ferroelectric material used for the electrophoretic deposition method described later (hereinafter called "second ferroelectric material") is provided. The second ferroelectric material is preferably amorphous. This allows the second ferroelectric material to be formed at a low temperature. The second ferroelectric material may be formed by a sol-gel method, a solid-phase method, or the like. Then, particles of the second ferroelectric material are formed by grinding the second ferroelectric material. The particle size of the particles of the second ferroelectric material is preferably about 10 to 100 nm mainly taking dispersibility in a step of forming coated particles described later into consideration.

A porous layer is formed on the surfaces of the particles of the second ferroelectric material to form coated particles. The porous layer is not particularly limited insofar as the porous layer has a structure having holes for receiving ions in a step of electrically charging the coated particles described later. The porous layer may be formed by using a sol-gel solution. The details are described below.

Figure 2:
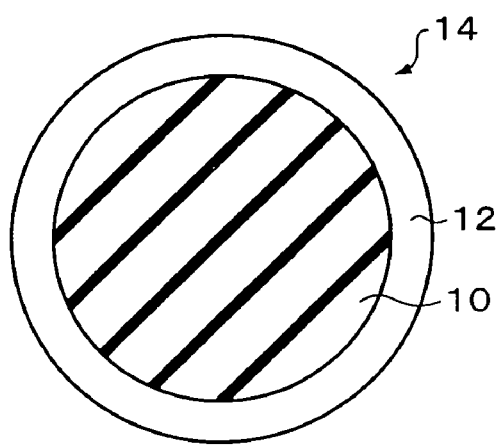
FIG. 2 is a diagram schematically showing a method of manufacturing a ferroelectric film according to one embodiment of the present invention.

The particles of the second ferroelectric material are immersed in a sol-gel solution for forming a porous layer. The particles are then dried and subjected to a heat treatment to solidify a porous layer. As a result, a coating particle 14 in which the surface of a particle 10 of the second ferroelectric material is covered by a porous layer 12 is formed, as shown in FIG. 2.

As the material for the porous layer 12, a silicate, a germanate, or the like may be used. As the silicate, lanthanum silicate ($La_2SiO_5$), bismuth silicate ($Bi_2SiO_5$), lead silicate ($PbSiO_3$), or the like may be used. As the germanate, lanthanum germanate ($La_2GeO_5$), bismuth germanate ($Bi_2GeO_5$), lead germanate ($PbGeO_3$), or the like may be used.

When using a silicate as the material for the porous layer 12, the silicate may be crystallized by a heat treatment at a temperature of about 400° C. In particular, the silicate becomes a part of the constituent atoms of the resulting ferroelectric film. In the case of a PbZrTiO ferroelectric film, since Ti which is the constituent atom of the ferroelectric film has an atomic radius close to that of Si which is the constituent atom of the silicate, Ti can be replaced by Si in a part of the ferroelectric film. In this case, since the characteristics of the ferroelectric film are not impaired, it is preferable to use the silicate as the material for the porous layer 12.

Figure 3:
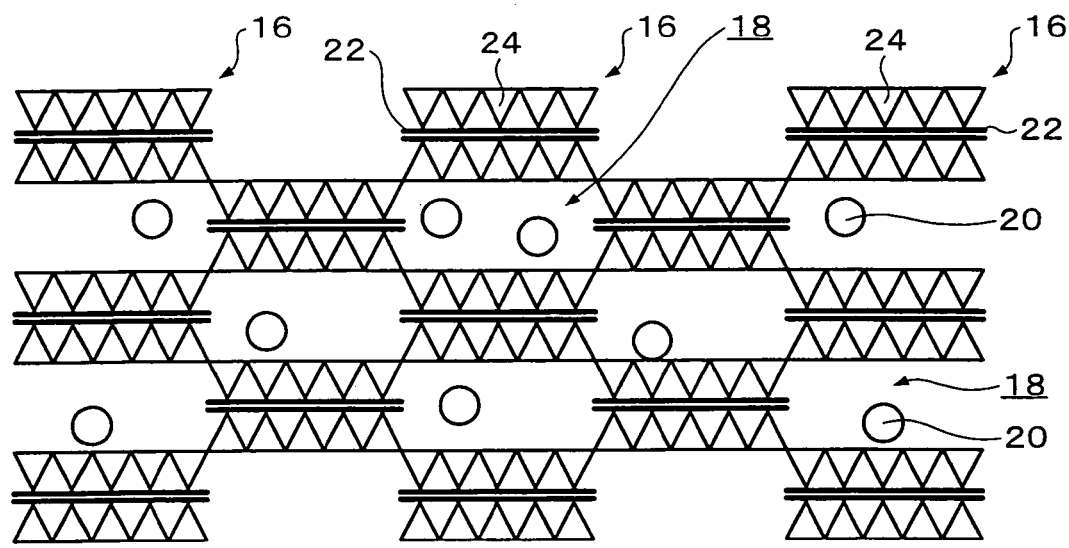
FIG. 3 is a diagram schematically showing a method of manufacturing a ferroelectric film according to one embodiment of the present invention.

As shown in FIG. 3, the porous layer 12 thus formed consists of crystal structures 16 arranged in a staggered arrangement, and has a large number of holes 18. When the porous layer 12 is bismuth silicate, the crystal structure 16 consists of two bismuth layers 22 and a plurality of tetrahedral silicon oxides 24 as shown in FIG. 3.

Then, the coated particles are electrically charged. The details are described below.

The coated particles 14 are dispersed in a solvent containing desired ions. This causes ions 20 contained in the solvent to enter the holes 18, as shown in FIG. 3. As a result, the coated particles 14 can be electrically charged.

As the ions contained in the solvent, cations or anions may be used. As the cations, $H^+$, $NH^{4+}$, or the like may be used. As the anions, $OH^-$, $Cl^-$, or the like may be used.

The solvent in which the particles 10 of the second ferroelectric material are dispersed is not particularly limited insofar as the solvent allows the ions 20 to be adsorbed on the porous layer 12 and the particles 10 of the second ferroelectric material to be electrically charged. As such a solvent, an organic solvent such as ketone or alcohol or an inorganic solvent such as water may be used, for example. When using ketone, $H^+$ is adsorbed on the porous layer 12. When using an alcohol, $OH^-$ is adsorbed on the porous layer 12.

As the ketone solvent, acetone, methyl ethyl ketone, methyl n-propyl ketone, methyl isopropyl ketone, diethyl ketone, acetylacetone, ethyl acetoacetate, hexanone, and the like can be given. Of these, acetone is preferable. Acetone is preferable because acetone has strong polarity. As the alcohol solvent, methanol, ethanol, and the like can be given. As the aqueous solution containing water as the solvent, a sodium hydroxide aqueous solution, a potassium hydroxide aqueous solution, an aqueous ammonia, and the like can be given.

Then, a ferroelectric material film is formed by the electrophoretic deposition method. The details are described below.

Figure 4:
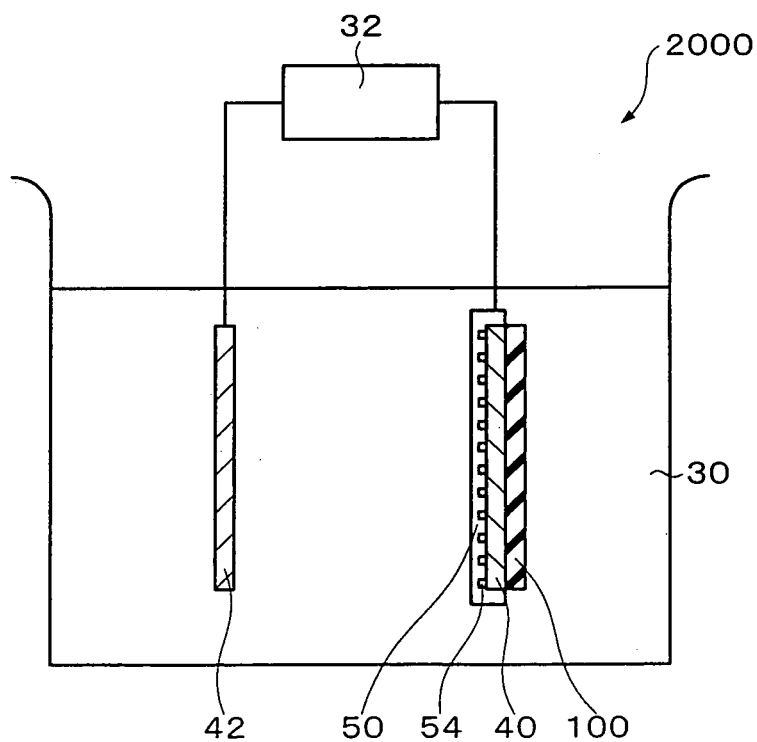
FIG. 4 is a diagram schematically showing a method of manufacturing a ferroelectric film according to one embodiment of the present invention.

As shown in FIG. 4, the first electrode 40 and a third electrode 42 of an electrophoretic deposition device 2000 are immersed in a solution 30 in which the coated particles 14 are dispersed. The ferroelectric initial nucleus layer 54 has been formed on the first electrode 40 by the above-described step. When voltage is applied between the first electrode 40 and the third electrode 42 by using a power supply 32, the electrically-charged coated particles 14 are deposited on the surface of the first electrode 40 by migration. As a result, a ferroelectric material film 50 is formed on the surface of the first electrode 40. The ferroelectric material film 50 is formed to cover the ferroelectric initial nucleus layer 54.

Since the above-described electrophoretic deposition method causes the particles of which the surfaces are ionized to be deposited, the thick ferroelectric material film 50 can be formed in a short period of time due to a high deposition rate.

In the electrophoretic deposition method, the first electrode 40 is used as a cathode when the ions 20 adsorbed on the porous layer 12 are cations. The first electrode 40 is used as an anode when the ions 20 adsorbed on the porous layer 12 are anions. As the third electrode 42, platinum, silver, nickel, or the like may be used.

The ferroelectric material film is subjected to a heat treatment to obtain a crystallized ferroelectric film. This heat treatment is performed to crystallize the amorphous ferroelectric material film. When using the silicate as the material for the porous layer in the above-described step of forming the coated particles, most of the silicates are released to the outside of the ferroelectric film by the heat treatment.

Figure 5:
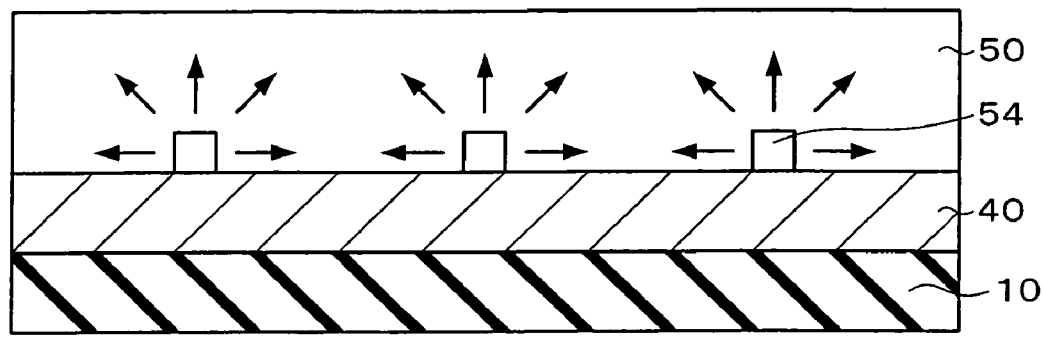
FIG. 5 is a diagram schematically showing a method of manufacturing a ferroelectric film according to one embodiment of the present invention.

As shown in FIG. 5, when crystallizing the ferroelectric material film, the ferroelectric material film 50 is crystallized to succeed to crystallinity and orientation of the ferroelectric initial nucleus layer 54 by the presence of the ferroelectric initial nucleus layer 54 having excellent crystallinity and orientation formed on the first electrode 40. As a result, a ferroelectric film having excellent crystallinity and orientation can be obtained. The arrows shown in FIG. 5 schematically indicate the state in which the ferroelectric material film 50 succeeds to crystallinity and orientation from the ferroelectric initial nucleus layer 54 when the ferroelectric material film 50 is crystallized.

Moreover, since the ferroelectric material film is amorphous, the ferroelectric material film 50 having excellent crystallinity and orientation can be obtained even if the heat treatment temperature is decreased in comparison with the case where the ferroelectric material film is polycrystalline. When the ferroelectric material film is polycrystalline, a high temperature is necessary to make the crystal orientation uniform. The heat treatment temperature is 450 to 650° C. when the ferroelectric material film is amorphous, although the temperature differs depending on the type of the ferroelectric film. The heat treatment is performed by rapid thermal annealing (RTA), for example.

A ferroelectric film can be manufactured by the above-described steps. This method of manufacturing a ferroelectric film has the following features.

According to the method of manufacturing a ferroelectric film of this embodiment, the ferroelectric initial nucleus layer 54 having excellent crystallinity and orientation is formed by hydrothermal electrodeposition. The ferroelectric material film 50 is then formed by electrophoretic deposition. When performing the heat treatment, the ferroelectric material film 50 is crystallized to succeed to crystallinity and orientation of the ferroelectric initial nucleus layer 54 by the presence of the ferroelectric initial nucleus layer 54 having excellent crystallinity and orientation. As a result, a ferroelectric film having excellent crystallinity and orientation can be obtained.

According to the method of manufacturing a ferroelectric film of this embodiment, since the electrophoretic deposition method with a high deposition rate is used, a thick ferroelectric film can be formed in a short period of time.

According to the method of manufacturing a ferroelectric film of this embodiment, since hydrothermal electrodeposition and electrophoretic deposition are used, the ferroelectric material film 50 is formed on the first electrode 40 by electrodeposition. Specifically, the ferroelectric material film 50 can be formed only on the surface of the first electrode 40. Therefore, the ferroelectric material film 50 can be selectively grown. A ferroelectric film can be selectively formed by crystallizing the ferroelectric material film 50 by the heat treatment.

Since the ferroelectric film can be selectively formed, it is unnecessary to perform a patterning step which is necessary in a conventional method when forming a ferroelectric capacitor or the like. As a result, damage caused by the patterning step does not occur on the ferroelectric film, whereby a ferroelectric film having excellent crystal quality can be provided. Therefore, a ferroelectric capacitor having excellent characteristics or the like can be realized. Moreover, a ferroelectric capacitor or the like can be formed by a simple process since the patterning step is unnecessary. A ferroelectric capacitor is formed as described below.

The first electrode 40 is formed on the substrate 100 by using a conventional method. The first electrode 40 forms a lower electrode of a ferroelectric capacitor. A ferroelectric film is formed on the surface of the first electrode 40 by applying the manufacturing method of the present invention. An upper electrode of a ferroelectric capacitor is formed on the ferroelectric film by using a conventional method. A ferroelectric capacitor is formed by the opposite surfaces of the lower electrode and the upper electrode and the ferroelectric film disposed between the lower electrode and the upper electrode.

An example of the manufacturing method is described below.

2. Example

In this example, a PbZrTiO (hereinafter called "PZT") ferroelectric film was formed.

A PZT first ferroelectric material consisting of $Pb(OH)_2$, $ZrOCl_2$, and $TiO_2$ was dissolved in a potassium hydroxide aqueous solution. The potassium hydroxide aqueous solution was adjusted to a pH of 12. The potassium hydroxide aqueous solution in which the first ferroelectric material was dissolved was heated to about 110° C. by using a hydrothermal electrodeposition device, and a voltage of about 1 V was applied between the electrodes. An island-shaped PZT ferroelectric initial nucleus layer with a thickness of about 20 nm was formed on the cathode plate. The deposition rate was about 20 nm/day. SRO was used as the cathode plate. Platinum was used as the anode plate.

A PZT second ferroelectric material was formed by the solid-phase method. The details are described below.

$Pb_2O_3$, $ZrO_2$, and $TiO_2$, which are starting materials of the PZT second ferroelectric material, were prepared at a desired composition (Pb:Zr:Ti=1.1:0.2:0.8). The materials weighed by a direct reading balance were placed in a polyethylene pot together with an agate stone and acetone, and mixed for 10 hours by ball milling. After sufficiently mixing the materials, the mixture was put into an enamel vat and dried by a dryer. The dried product was formed into the shape of a column by using a die at a pressure of about 800 kg/cm$^2$. The formed product was placed in an alumina crucible and presintered at 850° C. for two hours. As a result, an amorphous second ferroelectric material was prepared.

The second ferroelectric material was ground by using an alumina mortar to form particles of the second ferroelectric material. The particles of the second ferroelectric material were immersed in a sol-gel solution for forming $La_2SiO_5$ silicate. The particles were dried at 150° C. and subjected to a heat treatment in an oxidizing furnace at 400° C. for two hours. As a result, a coating particle in which the particle of the PZT second ferroelectric material was covered with the $La_2SiO_5$ silicate was formed.

The porous silicate absorbed H$^+$ by dispersing the coated particles in acetone to electrically charge the particles. Then, a voltage of about 400 V was applied between the electrodes by using an electrophoretic deposition device to form an amorphous PZT ferroelectric material film with a thickness of about 1 μm on the cathode plate on which the ferroelectric initial nucleus layer was formed. The deposition rate was about 1 μm/10 sec. The amorphous PZT ferroelectric material film was sintered at 600° C. for 15 minutes in an oxygen atmosphere to obtain a crystallized PZT ferroelectric film.

The method of manufacturing a ferroelectric film according to this embodiment may be applied to a method of manufacturing a ferroelectric memory or a piezoelectric device using the ferroelectric film. Another embodiment in which the method of manufacturing a ferroelectric film according to this embodiment is applied to a method of manufacturing a simple matrix type (cross-point type) ferroelectric memory is described below as an example.

3. Ferroelectric Memory

Figure 6:
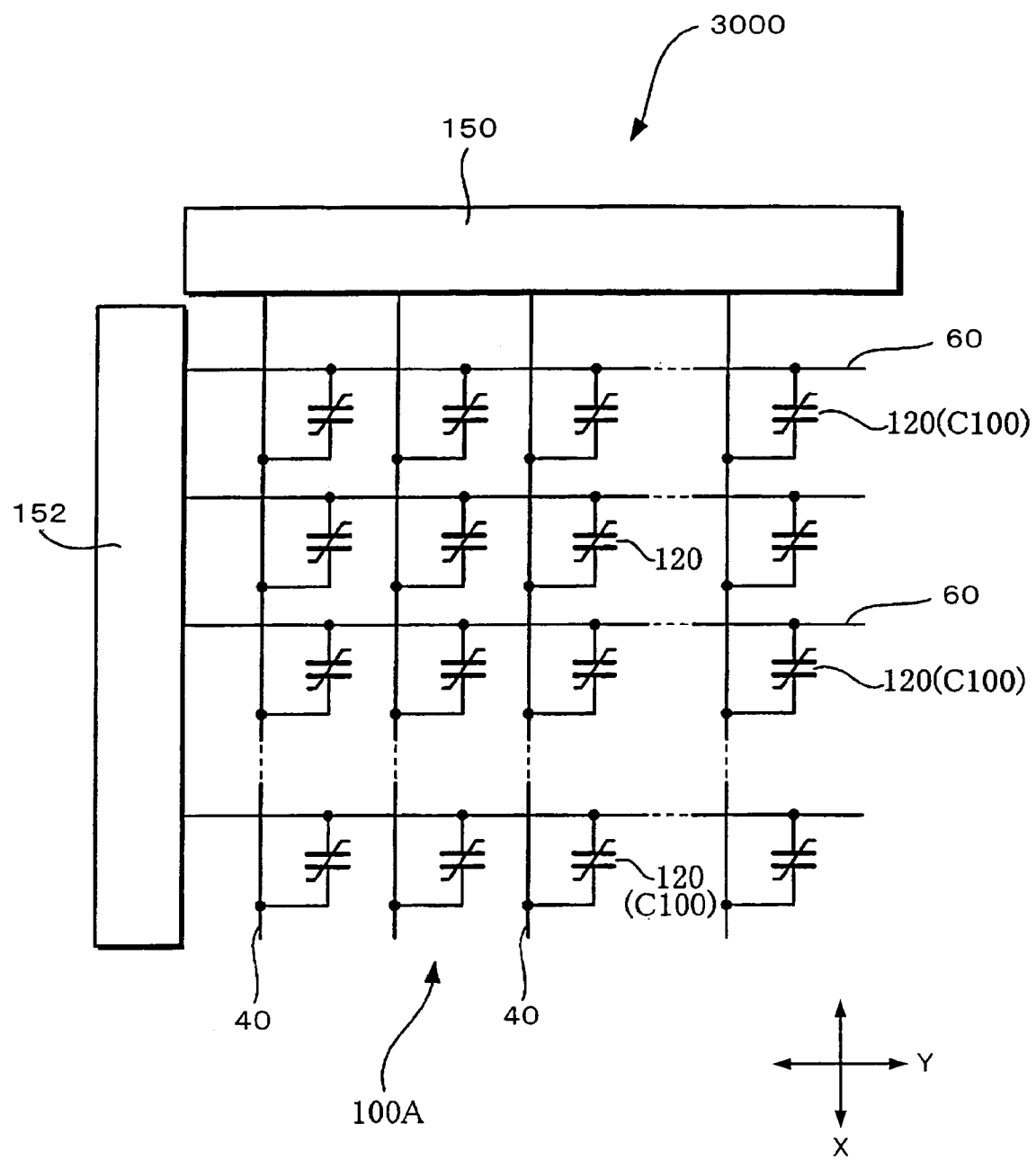
FIG. 6 is a plan view schematically showing a ferroelectric memory according to one embodiment of the present invention.
Figure 7:
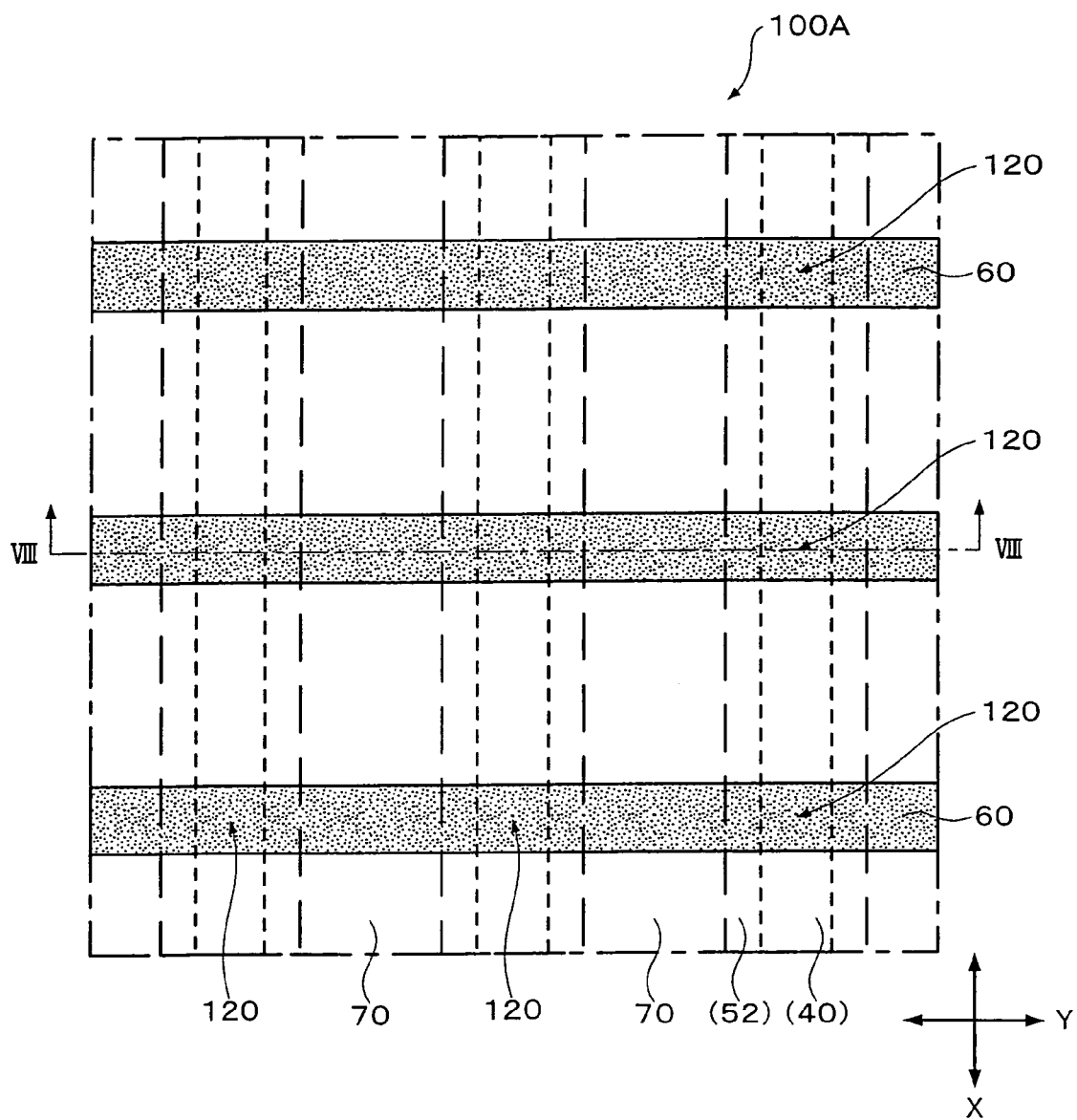
FIG. 7 is an enlarged plan view showing a part of a memory cell array according to one embodiment of the present invention.
Figure 8:
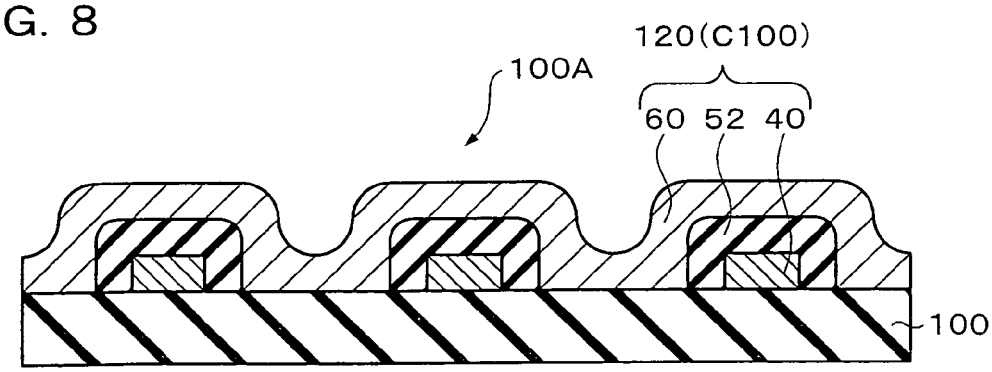
FIG. 8 is a cross-sectional view of the memory cell array taken along the line VIII—VIII shown in FIG. 7.

FIG. 6 is a plan view schematically showing a ferroelectric memory according to another embodiment of the present invention. FIG. 7 is an enlarged plan view showing a part of a memory cell array according to another embodiment of the present invention. FIG. 8 is a cross-sectional view along the line VIII–VIII shown in FIG. 7. In the plan views, numerals in parentheses indicate a layer under the uppermost layer.

As shown in FIG. 6, a ferroelectric memory device 3000 in this example includes a memory cell array 100A in which memory cells 120 are arranged in the shape of a simple matrix, and various circuits for selectively writing or reading data into or from the memory cells 120 (ferroelectric capacitors C100), such as a first driver circuit 150 for selectively controlling first signal electrodes (first electrodes) 20, a second driver circuit 152 for selectively controlling second signal electrodes (second electrodes) 60, and a signal detection circuit such as a sense amplifier (not shown).

In the memory cell array 100A, the first signal electrodes (wordlines) 40 for selecting rows and the second signal electrodes (bitlines) 60 for selecting columns are arranged to intersect at right angles. Specifically, the first signal electrodes 40 are arranged at a specific pitch along a direction X, and the second signal electrodes 60 are arranged at a specific pitch along a direction Y which intersects the direction X at right angles. The configuration of the signal electrodes may be the reverse of the above-described configuration. The first signal electrodes may be the bitlines and the second signal electrodes may be the wordlines.

In the memory cell array 100A according to this embodiment, the first signal electrode 40, a ferroelectric film 52 manufactured by applying the manufacturing method of the present invention, and the second signal electrode 60 are stacked on the insulating substrate 100, as shown in FIGS. 7 and 8. The first signal electrode 40, the ferroelectric film 52, and the second signal electrode 60 make up the ferroelectric capacitor 120. In more detail, the ferroelectric film 52 is formed on the first electrode (first signal electrode) 40 as described below by applying the manufacturing method of the present invention.

The first electrode (first signal electrode) 40 is formed on the substrate 100 in the shape of a stripe parallel to the direction X. The first electrode 40 forms the first signal electrode 40 of the ferroelectric memory. The ferroelectric film 52 is formed on the first signal electrode 40 by hydrothermal electrodeposition and electrophoretic deposition. The second signal electrode 60 is formed on the ferroelectric film 52 in the shape of a stripe parallel to the direction Y by a conventional method. A memory cell including the ferroelectric capacitor 120 is formed in the intersecting region of the first signal electrode 40 and the second signal electrode 60.

A dielectric layer 70 is formed between laminates consisting of the ferroelectric film 52 and the second signal electrode 60 so as to cover the exposed surfaces of the substrate 100 and the first signal electrode 40. The dielectric layer 70 preferably has a dielectric constant lower than that of the ferroelectric film 52. The stray capacitance of the first and second signal electrodes 40 and 60 can be reduced by allowing the dielectric layer 70 having a dielectric constant lower than that of the ferroelectric film 52 to be present between the laminates consisting of the ferroelectric film 52 and the second signal electrode 60. As a result, read and write operations of the ferroelectric memory 3000 can be performed at a higher speed.

An example of the read and write operations of the ferroelectric memory 3000 is described below.

In the read operation, a read voltage "$V_0$" is applied to the capacitor in the selected cell. This also serves as a write operation of "0". A current which flows through the selected bitline or a potential when causing the bitline to be in a high impedance state is read by using a sense amplifier. A given voltage is applied to the capacitors in the unselected cells in order to prevent occurrence of crosstalk during reading.

In the write operation of "1", a voltage "$-V_0$" is applied to the capacitor in the selected cell. When writing "0", a voltage which does not cause polarization reversal of the selected cell to occur is applied to the capacitor in the selected cell, whereby the "0" state written during the read operation is retained. A given voltage is applied to the capacitors in the unselected cells in order to prevent occurrence of crosstalk during writing.

According to the ferroelectric memory of this embodiment of the present invention, since the ferroelectric memory includes the ferroelectric capacitor including the ferroelectric film having excellent crystal structure, a highly reliable ferroelectric memory can be provided.

Although a simple matrix type ferroelectric memory is described in this embodiment, the ferroelectric memory of the present invention is not limited thereto. The ferroelectric memory of the present invention may be applied to other types of memory transistors. The ferroelectric capacitor in this embodiment may be applied to not only to the above ferroelectric memory but also to a pyroelectric sensor, a bimorph piezoactuator and the like.

Although only some embodiments of the present invention have been described in detail above, those skilled in the art will readily appreciate that many modifications are possible in the embodiments without departing from the novel teachings and advantages of this invention. Accordingly, all such modifications are intended to be included within the scope of this invention. For example, although an example using the amorphous second ferroelectric material is described in the above embodiments, a crystalline second ferroelectric material may be used instead. In this case, the heat treatment performed in the step (f) of the above method of manufacturing a ferroelectric film may be performed in order to obtain a specific crystal orientation.

What is claimed is:

1. A method of manufacturing a ferroelectric film, comprising:
    forming a ferroelectric initial nucleus layer by using a solution of a first ferroelectric material and electrodepositing the first ferroelectric material on an electrode by hydrothermal electrodeposition;
    electrically charging particles of a second ferroelectric material;
    forming a ferroelectric material film by electrodepositing the electrically-charged particles of the second ferroelectric material on the ferroelectric initial nucleus layer by electrophoretic deposition; and
    subjecting the ferroelectric material film to a heat treatment.

2. The method of manufacturing a ferroelectric film as defined in claim 1,
    wherein the ferroelectric initial nucleus layer is formed in the shape of islands.

3. The method of manufacturing a ferroelectric film as defined in claim 1,
    wherein the second ferroelectric material is amorphous.

4. The method of manufacturing a ferroelectric film as defined in claim 1,
    wherein the step of electrically charging the particles of the second ferroelectric material includes:
    forming coated particles by covering surfaces of the particles of the second ferroelectric material with a porous layer; and
    causing the porous layer to absorb ions.

5. The method of manufacturing a ferroelectric film as defined in claim 4,
    wherein the porous layer is a silicate.

* * * * *